United States Patent
Liu et al.

(10) Patent No.: US 9,823,567 B2
(45) Date of Patent: Nov. 21, 2017

(54) MANUFACTURING METHOD OF MASK PLATE FOR SHIELDING DURING SEALANT-CURING

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventors: Yong Liu, Beijing (CN); Xiaohe Li, Beijing (CN); Hongmin Li, Beijing (CN); Xianjie Shao, Beijing (CN); Qinghua Jiang, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 14/361,763

(22) PCT Filed: Jun. 14, 2013

(86) PCT No.: PCT/CN2013/077269
§ 371 (c)(1),
(2) Date: May 30, 2014

(87) PCT Pub. No.: WO2014/166155
PCT Pub. Date: Oct. 16, 2014

(65) Prior Publication Data
US 2015/0277226 A1    Oct. 1, 2015

(30) Foreign Application Priority Data
Apr. 11, 2013 (CN) .......................... 2013 1 0125028

(51) Int. Cl.
*G03F 7/40* (2006.01)
*G03F 7/20* (2006.01)
(Continued)

(52) U.S. Cl.
CPC ................. *G03F 7/20* (2013.01); *G03F 1/38* (2013.01); *G03F 1/50* (2013.01); *G03F 7/40* (2013.01)

(58) Field of Classification Search
CPC ..................................... G03F 7/20; G03F 7/40
(Continued)

(56) References Cited

U.S. PATENT DOCUMENTS 3,951,709 A * 4/1976 Jacob ........................ C23F 4/00
204/164
2002/0167634 A1* 11/2002 Watanabe ......... G02F 1/133512
349/153
(Continued)

FOREIGN PATENT DOCUMENTS

CN    1867457 A    11/2006
CN    101196690 A    6/2008
(Continued)

OTHER PUBLICATIONS

English translation of CN101196690A, Jiao et al., Published Jun. 2008.*
(Continued)

*Primary Examiner* — Thomas Pham
(74) *Attorney, Agent, or Firm* — Ladas & Parry LLP

(57) ABSTRACT

A manufacturing method of a mask plate for shielding during sealant-curing includes: forming a negative photoresist light-shielding material layer on a transparent substrate; with a color-filter mask plate set, exposing the substrate formed with the negative photoresist light-shielding material layer; developing the substrate after exposing to form the
(Continued)

pattern of the mask plate. The method does not require separate fabrication of a mask plate, thereby significantly reducing the manufacturing costs of the mask plate for shielding during sealant-curing.

8 Claims, 6 Drawing Sheets

(51) Int. Cl.
*C03C 15/00* (2006.01)
*C03C 25/68* (2006.01)
*C23F 1/00* (2006.01)
*B44C 1/22* (2006.01)
*G03F 1/38* (2012.01)
*G03F 1/50* (2012.01)

(58) Field of Classification Search
USPC .......................................................... 216/23
See application file for complete search history.

(56) References Cited

U.S. PATENT DOCUMENTS

| | | | |
|---|---|---|---|
| 2005/0085385 A1 | 4/2005 | Swihart et al. | |
| 2013/0222746 A1* | 8/2013 | Itoh et al. | 349/106 |
| 2013/0233482 A1* | 9/2013 | Chen et al. | 156/275.5 |
| 2015/0146130 A1 | 5/2015 | Chen et al. | |
| 2015/0277226 A1 | 10/2015 | Liu et al. | |

FOREIGN PATENT DOCUMENTS

| | | |
|---|---|---|
| CN | 101995762 A | 3/2011 |
| CN | 102331637 A | 1/2012 |
| CN | 103033975 A | 4/2013 |
| JP | 2009-188047 A | 8/2009 |
| JP | 2012-013840 A | 1/2012 |

OTHER PUBLICATIONS

First Chinese Office Action dated Sep. 3, 2014; Appln. No. 201310125023.3.
International Search Report mailed Jan. 23, 2014; PCT/CN2013/077269.
International Preliminary Report on Patentability Appln. No. PCT/CN2013/077269; Dated Oct. 13, 2015.
Internatianal Search Report dated Jan. 2, 2014; PCT/CN2013/077946.
International Preliminary Report on Patentability dated Sep. 29, 2015; PCT/CN2013/077946.
USPTO NFOA dated Jun. 10, 2016 in connection with U.S. Appl. No. 14/422,532.
USPTO FOA dated Oct. 18, 2016 in connection with U.S. Appl. No. 14/422,532.
First Chinese Office Action dated Mar. 3, 2017; Appln. No. 201310097951.0.

* cited by examiner

MANUFACTURING METHOD OF MASK PLATE FOR SHIELDING DURING SEALANT-CURING

TECHNICAL FIELD

Embodiments of the present invention relate to a manufacturing method of a mask plate for shielding during sealant-curing.

BACKGROUND

Among flat-panel display devices, thin film transistor liquid crystal display (TFT-LCD), by virtue of its features such as small size, low power consumption, relatively low manufacturing-cost and no radiation, etc., have occupied a dominant position in the current flat panel display market.

A main structure of a TFT-LCD typically comprises: an array substrate and a color-filter substrate, which are cell-assembled and secured together by sealant. In manufacturing processes of a TFT-LCD, sealant needs to be cured, and a sealant-curing process mainly comprises two steps. Firstly, sealant is precured through UV (Ultra-Violet Ray) radiation; then, sealant is thermal-cured by heating. During sealant-precuring, in order to avoid the impact of UV on an effective viewing area of a liquid crystal panel and resulting in a defect in the product, usually, a mask plate (UV photomask plate) for shielding during sealant-curing is required to cover the effective viewing area of a liquid crystal panel.

A UV photomask plate is usually formed through a patterning process. A conventional manufacturing method mainly comprises steps as follows: a light-shielding metal thin-film layer is deposited on a glass substrate; a positive photoresist material layer is coated on the substrate; with a dedicated mask, the substrate is subjected to exposure and development; the substrate is subjected to etching to remove the corresponding light-shielding metal thin film in a sealant region of the liquid crystal panel; the remaining positive photoresist material layer is removed.

A drawback of the conventional technology lies in that, it requires to separately prepare the mask plate used in the UV-photomask plate manufacturing process, which makes the manufacturing costs of the UV photomask plate high and is unbeneficial to resource-saving.

SUMMARY

Embodiments of the present invention provide a manufacturing method of a mask plate for shielding during sealant-curing, in order to reduce the manufacturing costs of the mask plate.

The manufacturing method of a mask plate for shielding during sealant-curing, provided by an embodiment of the present invention, comprises: forming a negative photoresist light-shielding material layer on a transparent substrate; exposing the substrate formed with the negative photoresist light-shielding material layer with a color-filter mask plate set; and developing the substrate after exposing to form the pattern of the mask plate.

Optionally, forming of a negative photoresist light-shielding material layer on a transparent substrate comprises: forming a light-shielding metal layer on a transparent substrate; and forming a negative photoresist material layer on the substrate formed with the light-shielding metal layer.

Preferably, for example, developing of the substrate after exposing to form the pattern of the mask plate comprises: developing the substrate after exposing; and etching the light-shielding metal layer of the substrate after developing to etching to form the pattern of the mask plate.

Optionally, the color-filter substrate comprises at least three color-filter layers of different colors. The color-filter substrate comprises at least three color-filter layers of different colors, which are different in width in any pair; the color-filter mask plate set comprises: at least three types of color-filter masks that are in one-to-one correspondence with the color-filter layers of different colors; and exposing of the substrate formed with the negative photoresist light-shielding material layer with the color-filter mask plate set comprises: with at least three types of color-filter masks that are in one-to-one correspondence with the color-filter layers respectively, exposing the substrate formed with the negative photoresist light-shielding material layer, so that a region on the substrate corresponding to a formed light-shielding pattern is exposed.

Optionally, the color-filter substrate comprises at least three color-filter layers of different colors, which are all equal in width; the color-filter mask plate set comprises one type of color-filter mask plate that corresponds to the color-filter layers; and exposing of the substrate formed with the negative photoresist light-shielding material layer with a mask plate set comprises: with the one type of color-filter mask plate that corresponds to the color-filter layers, exposing the substrate formed with the negative photoresist light-shielding material layer at least three times, so that a region on the substrate corresponding to a formed light-shielding pattern is exposed, wherein, for every two continuous times of exposing, a position of the one type of color-filter mask plate is shifted by a predetermined distance.

Optionally, the color-filter substrate comprises at least three color-filter layers of different colors, of which at least two but not all are equal in width; the mask plate set comprises a shared mask plate that corresponds to the color-filter layers equal-in-width, and an alone-used mask plate set, of which each mask plate corresponds to each color-filter layer other than the color-filter layers equal-in-width; and exposing of the substrate formed with the negative photoresist light-shielding material layer with a mask plate set, comprises: with the shared mask, exposing the substrate formed with the negative photoresist light-shielding material layer at least two times, and with each alone-used mask plate that corresponds to each color-filter layer other than the color-filter layers equal-in-width, exposing the substrate formed with the negative photoresist light-shielding material layer respectively, so that a region on the substrate corresponding to a formed light-shielding pattern is exposed; wherein, in exposing of the substrate with the shared mask, for every two continuous times of exposing, a position of the shared mask plate is shifted by a predetermined distance.

BRIEF DESCRIPTION OF THE DRAWINGS

In order to clearly illustrate the technical solutions of the embodiments of the invention, the drawings of the embodiments will be briefly described in the following; it is obvious that the described drawings are only related to some embodiments of the invention and thus are not limitative of the invention.

DETAILED DESCRIPTION OF THE PREFERRED EMBODIMENTS

In order to make objects, technical details and advantages of the embodiments of the invention apparent, the embodiments will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Unless otherwise defined, technical or scientific terms used herein should be interpreted in the usual sense as understood by those ordinary skilled in the relevant art of the present invention. The terms "first", "second", and the like, used in the specification and claims of this patent application of the invention, do not denote any order, quantity, or importance, but are used to distinguish among different integral parts. Likewise, the words "a" or "an" or the like, herein do not denote a limitation of quantity, but denote the presence of at least one of the referenced item. The words "comprise" or "include" or the like, are referred to that the elements or objects which appear before the word "comprise" or "include" encompass the elements or objects and their equivalents which are enumerated after the word "comprise" or "include", and do not exclude other elements or objects. The terms "connect" or "joint" or the like, are not limited to physical or mechanical connections, but may comprise electrical connection, whether direct or indirect. The terms "on", "below", "left", "right" and the like, are only used to indicate a relative positional relationship, which may be varied with a change of an absolute position of a described object.

In order to reduce the manufacturing costs of a mask plate for shielding during sealant-curing, an embodiment of the present invention provides a manufacturing method of the mask plate for shielding during sealant-curing. In the technical solution of the embodiment of the invention, a substrate is exposed by utilizing a color-filter mask plate set that is used in exposing a color-filter layer during fabrication of a color-filter substrate, and therefore separate fabrication of a mask plate is not required any more, which significantly reduces the manufacturing costs of the mask plate for shielding during sealant-curing. In order to make the purpose, technical solutions and advantages of the present invention more clear, hereinafter, the embodiments of the present invention will be further described in detail.

Figure 1:
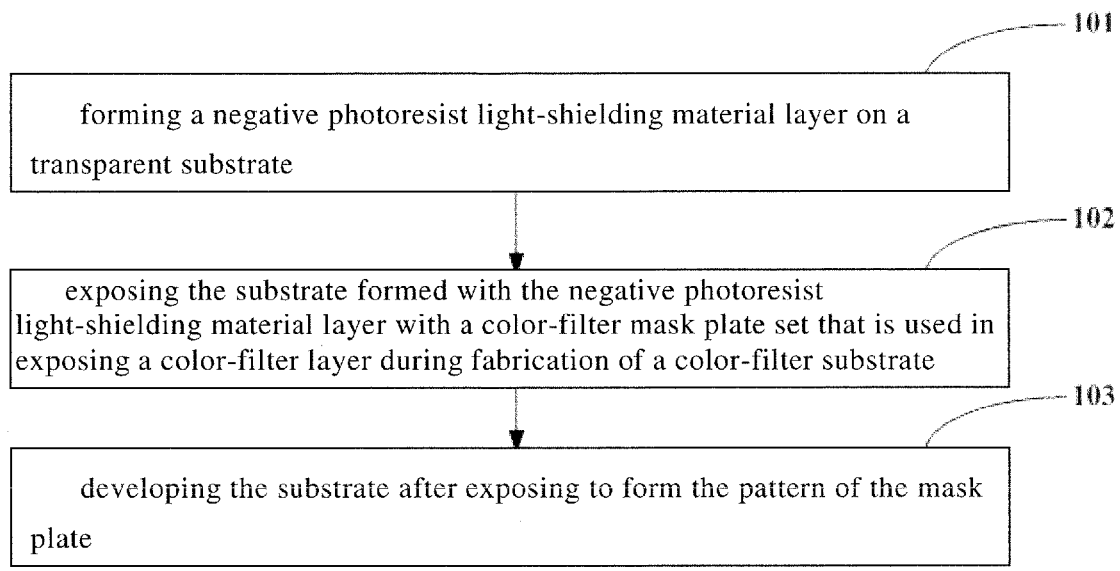
FIG. 1 is a schematic flowchart illustrating a manufacturing method of a mask plate for shielding during sealant-curing according to a first embodiment of the invention.

As shown in FIG. 1, the manufacturing method of a mask plate for shielding during sealant-curing, according to a first embodiment of the invention, comprises the following:

step 101, a negative photoresist light-shielding material layer is formed on a transparent substrate;

step 102, with a color-filter mask plate set that is used in exposing a color-filter layer during fabrication of a color-filter substrate, the substrate formed with the negative photoresist light-shielding material layer is subjected to exposing; and step 103, the substrate after exposing is subjected to developing to form the pattern of the mask plate.

Figure 2A:
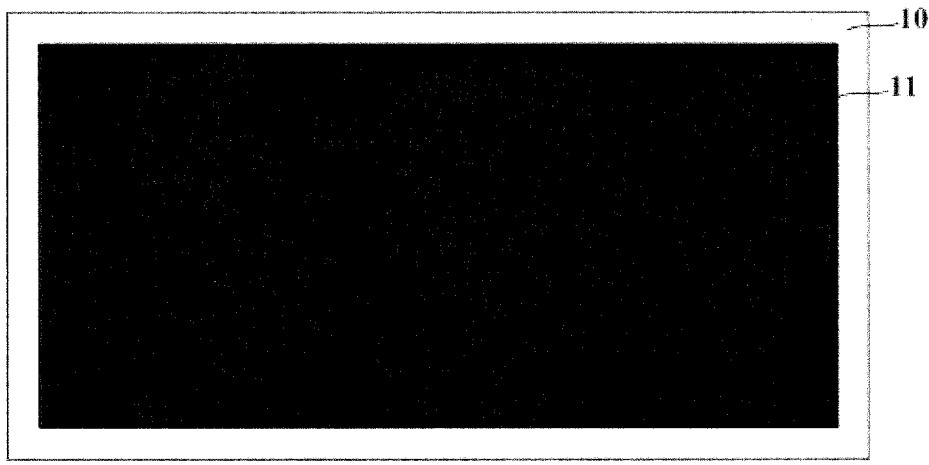
FIG. 2a is a schematic structural diagram of a top view of the mask plate for shielding during sealant-curing, according to the first embodiment of the invention.
Figure 2B:
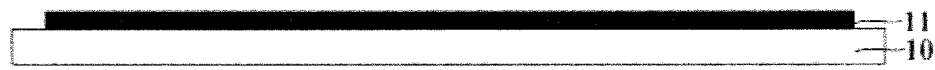
FIG. 2b is a schematic structural diagram of a cross-section of the mask plate for shielding during sealant-curing, according to the first embodiment of the invention.

As shown in FIG. 2a and FIG. 2b, the structure of the mask plate for shielding during sealant-curing comprises: a transparent substrate 10 and a light-shielding layer 11 located on the transparent substrate 10. The material of the transparent substrate 10 is not limited herein, which may be glass, resin, etc. As a liquid crystal panel undergoes a sealant-precuring process, the light-shielding layer 11 covers the effective viewing area of the liquid crystal panel, to avoid producing an adverse impact and resulting in a defect in the product. In this embodiment of the invention, the light-shielding layer 11 may comprise a negative photoresist light-shielding material, that is to say, for a substrate after exposing and developing, the negative photoresist light-shielding material in its exposed region is retained, while the negative photoresist light-shielding material in its non-exposed region will be removed.

In this embodiment, a color-filter mask plate set that is used in exposing a color-filter layer during fabrication of a color-filter substrate is employed to expose the substrate formed with the negative photoresist light-shielding material layer. The fabrication of the mask plate set can be done in a fabrication plant of a color-filter substrate. Compared with the conventional technology, separate fabrication of a mask plate is not required, thereby significantly reducing the manufacturing costs of the mask plate for shielding during sealant-curing.

A main structure of a TFT-LCD typically comprises an array substrate and a color-filter substrate that are cell-assembled together, and the color-filter substrate mainly comprises a glass substrate, a black matrix (BM), a color-filter layer and a protective film. The black matrix mainly functions to block stray light and prevent light leakage between pixels. The color-filter layer comprises an R(Red)-filter layer, a G(Green)-filter layer and a B(Blue)-filter layer, and mainly functions to generate RGB(red, green and blue) primary colors by means of light filtering and then mix the RGB primary colors in a proportion of intensity among them, so as to produce various colors and enable the TFT-LCD to display full colors.

It should be noted that, in the field of liquid crystal displays, the color-filter layer is not limited to the three colors of RGB (Red Green Blue), but also may adopt RGBW (Red Green Blue White), RGBY (Red Green Blue Yellow), CMYK (Cyan Magenta Yellow Black) or many other color combinations.

In a second embodiment of the invention, the color-filter substrate may comprise at least three color-filter layers of different colors. The color-filter layers are different in width in any pair. The color-filter mask plate set comprises at least three types of color-filter masks that are in one-to-one correspondence with the color-filter layers of the different colors. The step, in which the substrate formed with the negative photoresist light-shielding material layer is subjected to exposing with a color-filter mask plate set, comprises the following:

With the at least three types of color-filter mask plates that are in one-to-one correspondence with the color-filter layers, the substrate formed with the negative photoresist light-shielding material layer is subjected to exposing respectively, so that, the region on the substrate corresponding to the formed light-shielding patterns of the mask plates is exposed.

In a third embodiment of the invention, the color-filter substrate may comprise at least three color-filter layers of different colors, which are all equal in width. The color-filter mask plate set comprises one type of color-filter mask plate that corresponds to the color-filter layers. The step, in which the substrate formed with the negative photoresist light-shielding material layer is subjected to exposing with a mask plate set, comprises the following:

With the one type of color-filter mask plate that corresponds to the color-filter layers, the substrate formed with the negative photoresist light-shielding material layer is subjected to at least three times of exposing, so that the region on the substrate corresponding to the formed light-shielding pattern of the mask plate is exposed, and for every two continuous times of exposing, the position of the one type of color-filter mask plate is shifted by a predetermined distance.

In a fourth embodiment of the invention, the color-filter substrate comprises at least three color-filter layers of different colors, of which at least two but not all are equal in width. The mask plate set comprises a shared mask plate that corresponds to the color-filter layers equal in width, and an alone-used mask plate set, of which each mask plate corresponds to each of the color-filter layers other than the color-filter layers equal in width. The step, that the substrate formed with the negative photoresist light-shielding material layer is subjected to exposing by utilizing a mask plate set, comprises the following:

With the shared mask, the substrate formed with the negative photoresist light-shielding material layer is subjected to at least two times of exposing, and with each alone-used mask that belongs to the alone-used mask plate set and corresponds to each of the color-filter layers other than the color-filter layers equal-in-width, the substrate formed with the negative photoresist light-shielding material layer is subjected to exposing respectively, so that the region on the substrate corresponding to the formed light-shielding patterns of the mask plates is exposed; when the substrate is subjected to exposing with the shared mask, for every two continuous times of exposing, the position of the shared mask plate is shifted by a predetermined distance.

For convenience of description, the following examples all based on the RGB three-color mode to give detailed explanation of the above embodiments; however, the embodiments of the present invention are not limited thereto.

Figure 3A:
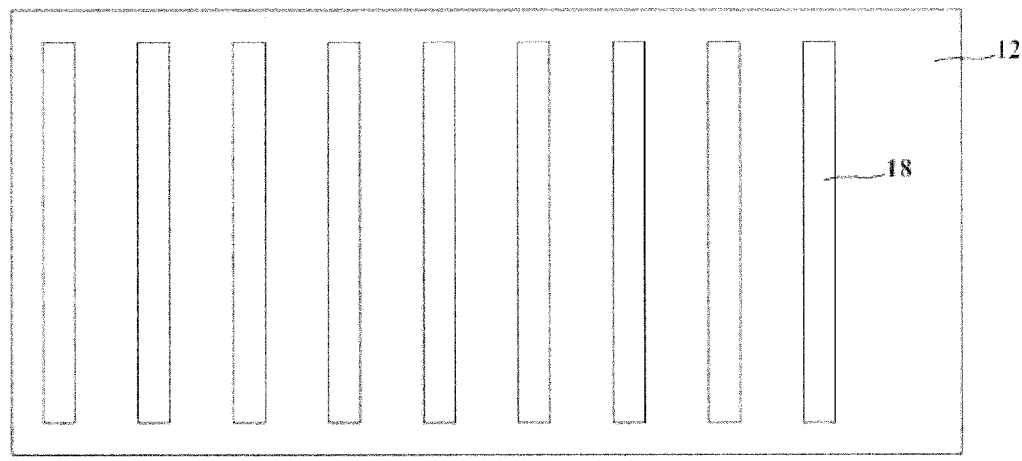
FIG. 3a is an exemplary schematic structural diagram of a first mask according to a second embodiment of the invention.
Figure 3B:
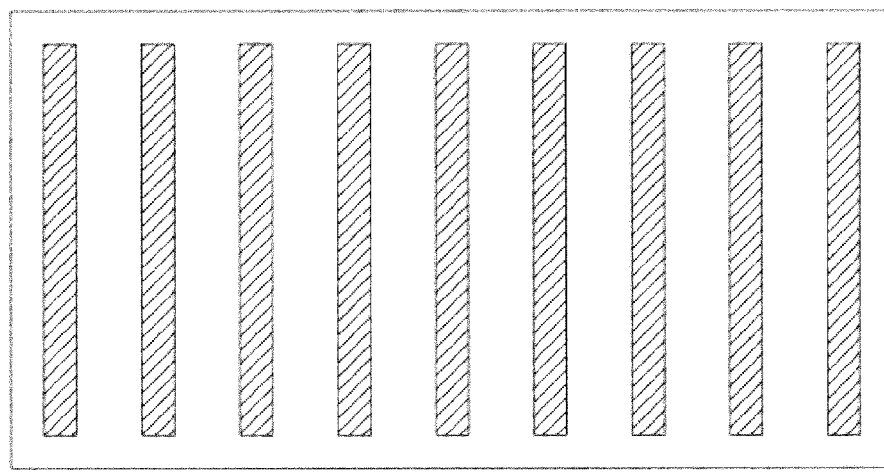
FIG. 3b is an exemplary schematic structural diagram of a substrate, after first-time exposing by utilizing the first mask, according to the second embodiment of the invention.
Figure 4A:
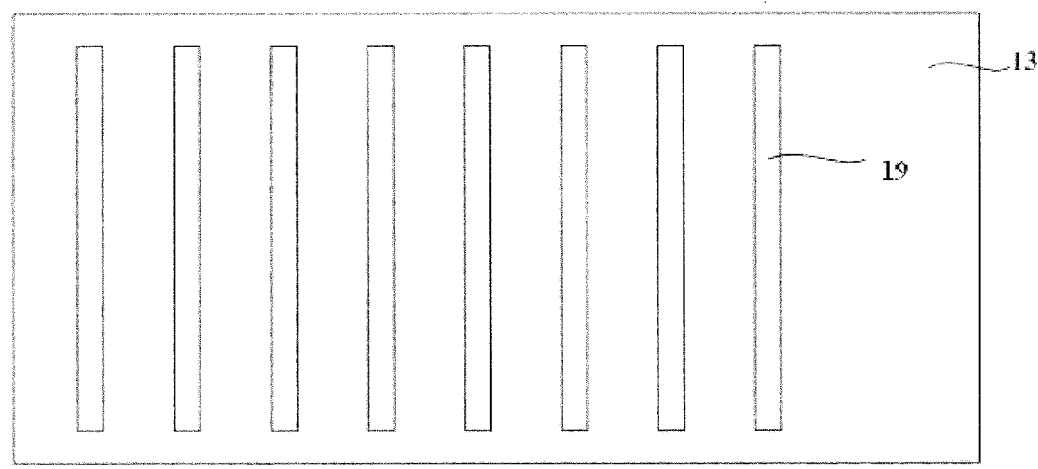
FIG. 4a is an exemplary schematic structural diagram of a second mask according to the second embodiment of the invention.
Figure 4B:
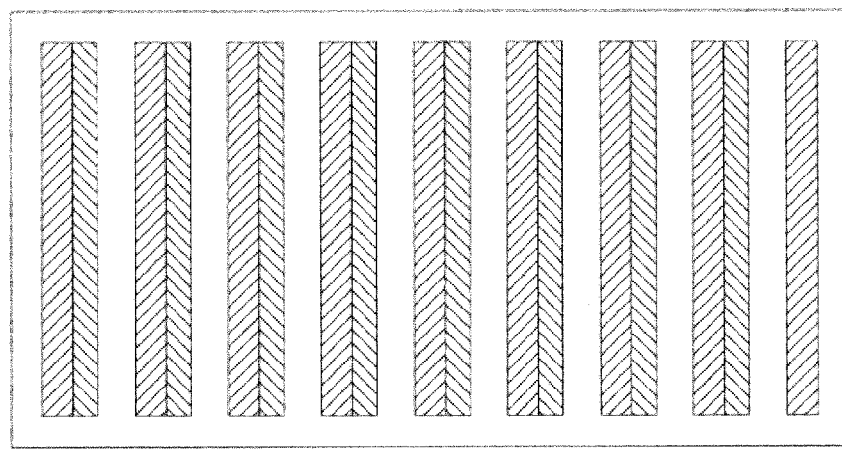
FIG. 4b is an exemplary schematic structural diagram of the substrate, after second-time exposing by utilizing the second mask, according to the second embodiment of the invention.
Figure 5A:
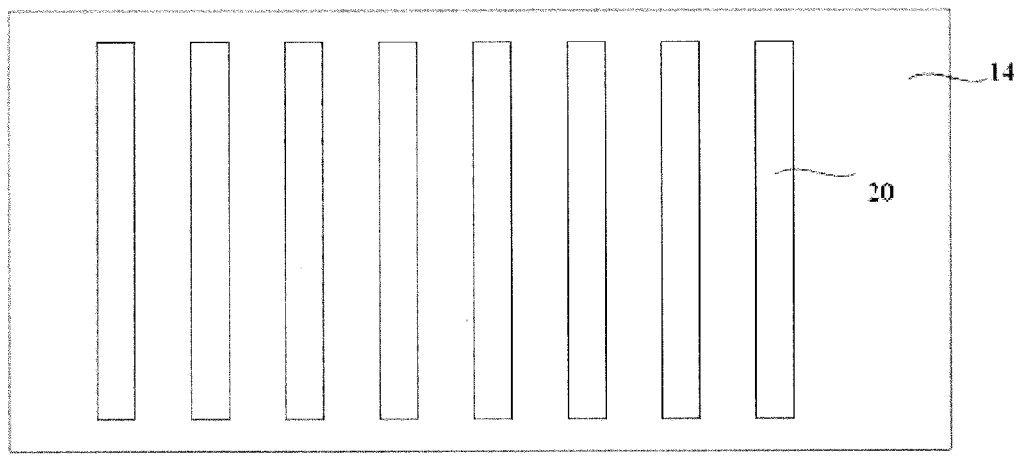
FIG. 5a is an exemplary schematic structural diagram of a third mask according to the second embodiment of the invention.

In a fabrication plant of color-filter substrates, the fabricated color-filter substrates may have a variety of structural forms. For example, a color-filter substrate may comprise an R-filter layer, a G-filter layer and a B-filter layer, which are different in width in any pair. FIG. 3a to FIG. 5b show an example in accordance with the second embodiment. As shown in FIG. 3a, FIG. 4a and FIG. 5a, during fabrication of the color-filter substrate, a mask plate set that is used in exposing the color-filter layer comprises a first mask plate 12, a second mask plate 13 and a third mask plate 14; the light-transmissive region 18 of the first mask plate 12 corresponds to the area of the R-filter layer of the color-filter substrate, the light-transmissive region 19 of the second mask plate 13 corresponds to the area of the G-filter layer of the color-filter substrate, and the light-transmissive region 20 of the third mask plate 14 corresponds to the area of the B-filter layer of the color-filter substrate.

Figure 5B:
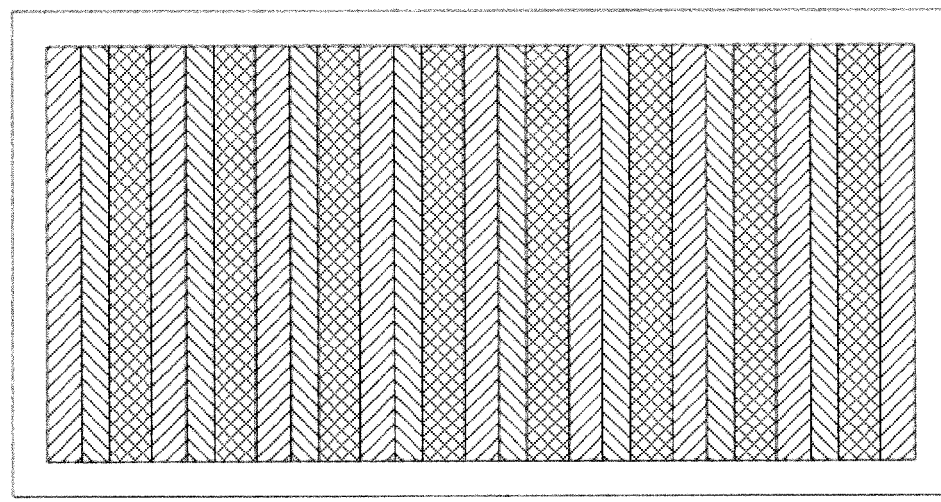
FIG. 5b is an exemplary schematic structural diagram of the substrate, after third-time exposing by utilizing the third mask, according to the second embodiment of the invention.

The step, in which the substrate formed with the negative photoresist light-shielding material layer is subjected to exposing with the mask plate set, comprises the following: with the first mask plate 12, the second mask plate 13 and the third mask plate 14 respectively, the substrate formed with the negative photoresist light-shielding material layer is subjected to exposing, so that the region on the substrate corresponding to the formed light-shielding patterns is exposed. With the first mask plate 12, the structure of the substrate after first-time exposing is as shown in FIG. 3b; with the second mask plate 13, the structure of the substrate after second-time exposing is as shown in FIG. 4b; with the third mask plate 14, the structure of the substrate after third-time exposing is as shown in FIG. 5b. As can be seen, with the mask plate set, altogether through three times of exposing, the part of the substrate corresponding to the effective viewing area of a liquid crystal panel can be completely exposed.

Figure 6A:
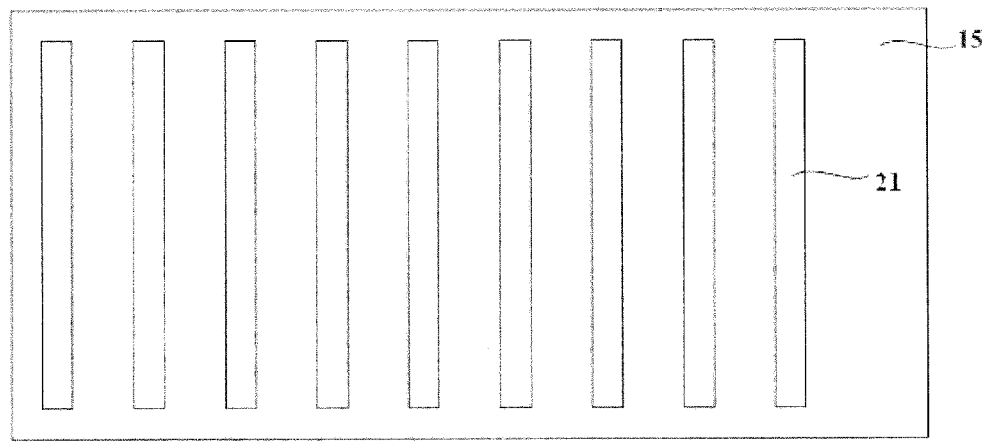
FIG. 6a is an exemplary schematic structural diagram of a fourth mask, according to a third embodiment of the invention.

For instance, in an example in accordance with the third embodiment, a color-filter substrate may comprise an R-filter layer, a G-filter layer and a B-filter layer, which are all equal in width. As shown in FIG. 6a, during fabrication of the color-filter substrate, a mask plate set that is used in exposing the color-filter layer comprises a fourth mask plate 15; the light-transmissive region 2 of the fourth mask plate 15 may correspond to the area of the R-filter layer, the area of the G-filter layer or the area of the B-filter layer of the color-filter substrate.

The step, in which the substrate formed with the negative photoresist light-shielding material layer is subjected to exposing with the mask plate set, comprises the following:

With the fourth mask plate 15, the substrate formed with the negative photoresist light-shielding material layer is subjected to at least three times of exposing, so that the region on the substrate corresponding to the formed light-shielding pattern is exposed; for every two continuous times of exposing, the position of the fourth mask plate 15 is shifted by a predetermined distance.

Figure 6B:
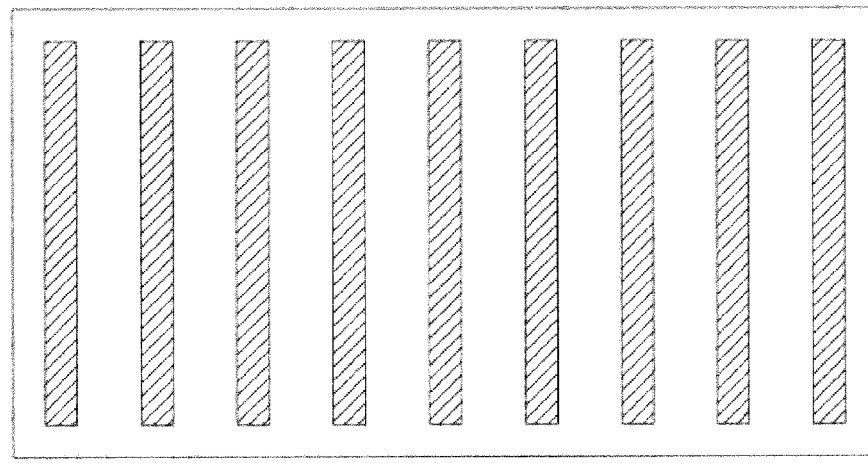
FIG. 6b is an exemplary schematic structural diagram of a substrate, after first-time exposing by utilizing the fourth mask, according to the third embodiment of the invention.
Figure 6C:
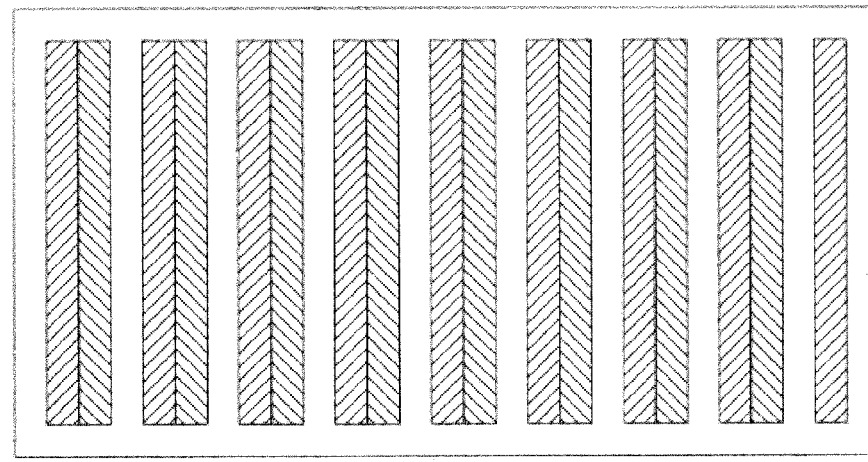
FIG. 6c is an exemplary schematic structural diagram of the substrate, after second-time exposing by utilizing the fourth mask, according to the third embodiment of the invention.
Figure 6D:
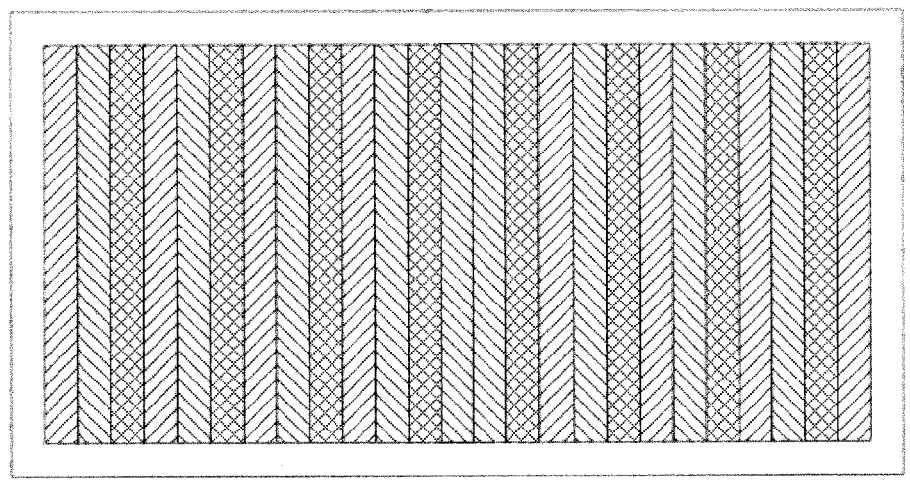
FIG. 6d is an exemplary schematic structural diagram of the substrate, after third-time exposing by utilizing the fourth mask, according to the third embodiment of the invention.

If the predetermined distance is as great as the width of one filter layer, that is, the fourth mask plate 15 is shifted by the width of one filter layer after completion of one time of exposing, then, in this embodiment, through only three times of exposing, the part of the substrate corresponding to the effective viewing area of a liquid crystal panel can be completely exposed. In the technical solution of this embodiment, only one mask plate is used, which significantly reduces the manufacturing costs of the mask plate for shielding during sealant-curing. With the fourth mask plate 15, the structure of the substrate after first-time exposing is as shown in FIG. 6b; with the fourth mask plate 15, the structure of the substrate after second-time exposing is as shown in FIG. 6c; with the fourth mask plate 15, the structure of the substrate after third-time exposing is as shown in FIG. 6d. In spite of that, if the predetermined distance is less than the width of one filter layer, then more than three times of exposing may be implemented with the fourth mask plate 15, as long as ultimately the part of the substrate corresponding to the effective viewing area of a liquid crystal panel can be completely exposed. For example, if the predetermined distance is as great as half the width of one filter layer, then complete exposure can be done through minimum six times of exposing.

Figure 7A:
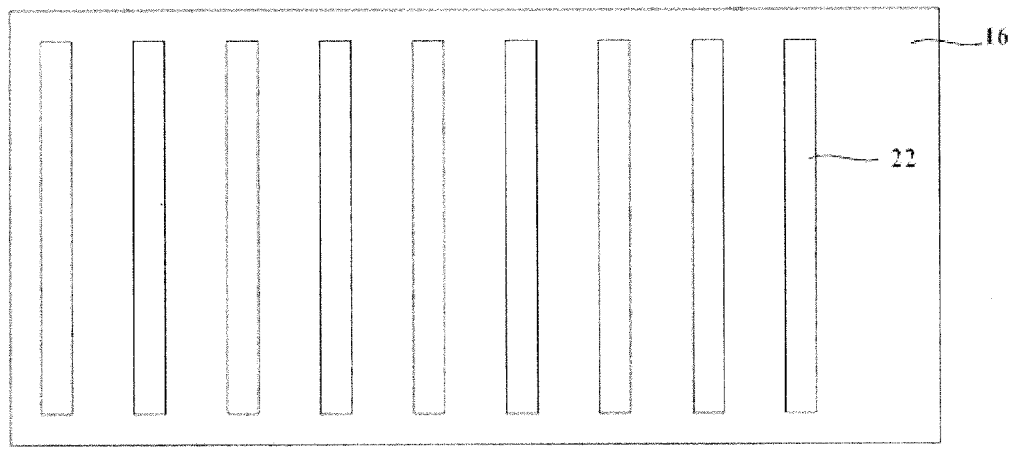
FIG. 7a is an exemplary schematic structural diagram of a fifth mask according to a fourth embodiment of the invention.
Figure 8A:
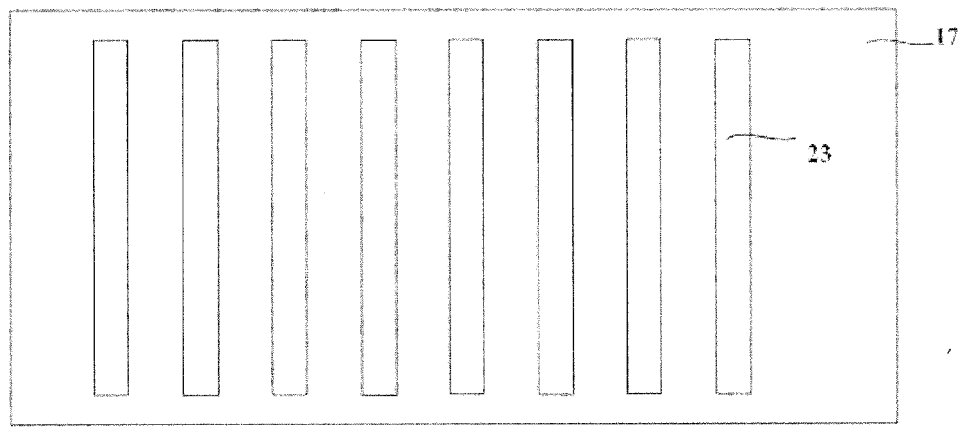
FIG. 8a is an exemplary schematic structural diagram of a sixth mask according to the fourth embodiment of the invention.

For instance, in yet another example in accordance with the fourth embodiment, a color-filter substrate may comprise an R-filter layer, a G-filter layer and a B-filter layer, of which two are equal in width. As shown in FIG. 7a and FIG. 8a, during fabrication of the color-filter substrate, a mask plate set that is used in exposing the color-filter layer comprises a fifth mask plate 16 and a sixth mask plate 17. The light-transmissive region 22 of the fifth mask plate 16 corresponds to the area of either of the two filter layers equal in width in the color-filter substrate; the light-transmissive region 23 of the sixth mask plate 17 corresponds to the area of the filter layer other than the two filter layers equal in width in the color-filter substrate. For example, if the R-filter layer and the G-filter layer of the color-filter substrate are equal in width, then the light-transmissive region 22 of the fifth mask plate 16 corresponds to the area of the R-filter layer or the area of the G-filter layer, while the light-transmissive region 23 of the sixth mask plate 17 corresponds to the area of the B-filter layer of the color-filter substrate.

The step, in which the substrate formed with the negative photoresist light-shielding material layer is subjected to exposing with the mask plate set, comprises the following: with the fifth mask plate 16 and the sixth mask plate 17 respectively, the substrate formed with the negative photoresist light-shielding material layer is subjected to exposing, so that the region on the substrate corresponding to the formed light-shielding pattern is exposed; with the fifth mask plate 16, the substrate is subjected to at least two times of exposing, and for every two continuous times of exposing, the position of the fifth mask plate 16 is shifted by a predetermined distance.

Figure 7B:
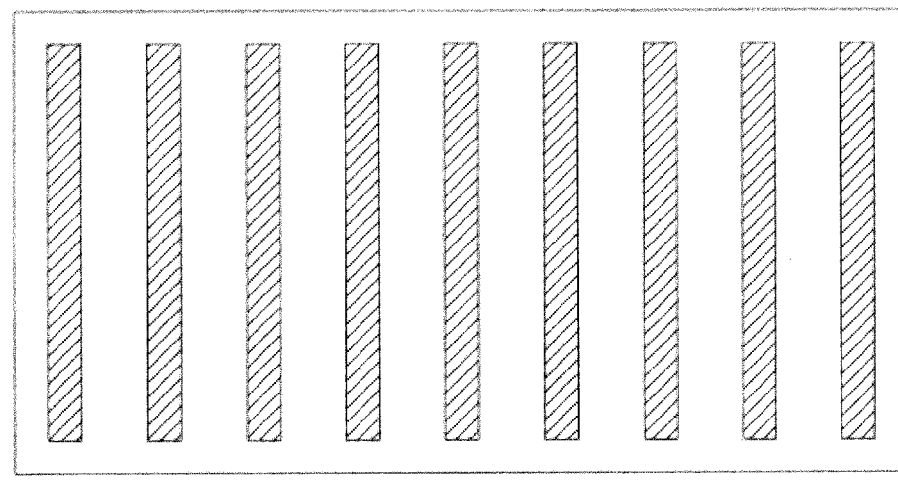
FIG. 7b is an exemplary schematic structural diagram of a substrate, after first-time exposing by utilizing the fifth mask, according to the fourth embodiment of the invention.
Figure 7C:
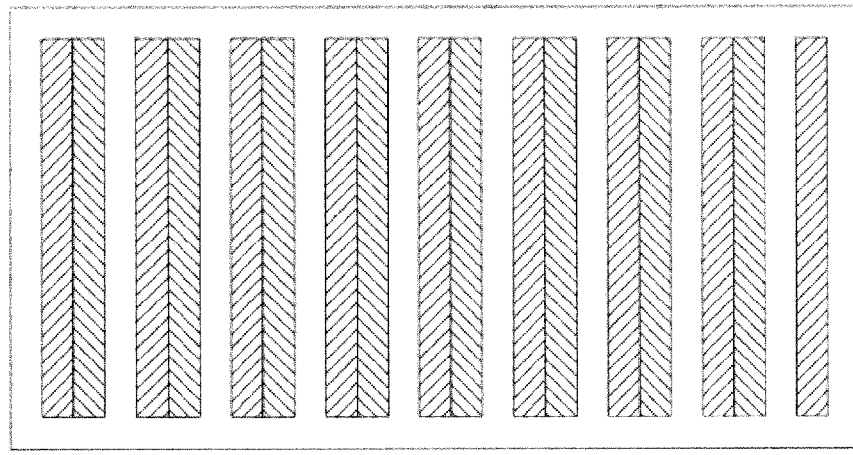
FIG. 7c is an exemplary schematic structural diagram of the substrate, after second-time exposing by utilizing the fifth mask, according to the fourth embodiment of the invention.

In the mask plate set, the fifth mask plate 16 may be used in exposing for the two filter layers equal in width. For example, if the R-filter layer and the G-filter layer are equal in width, but their width is unequal to the width of the B-filter layer, then the fifth mask plate 16 can be used in exposing for both the R-filter layer and the G-filter layer. Its usage-principle is similar to that of the fourth mask plate 15, of which the description is omitted here. With the fifth mask plate 16, the structure of the substrate after first-time exposing is as shown in FIG. 7b; with the fifth mask plate 16, the structure of the substrate after second-time exposing is as shown in FIG. 7c.

Figure 8B:
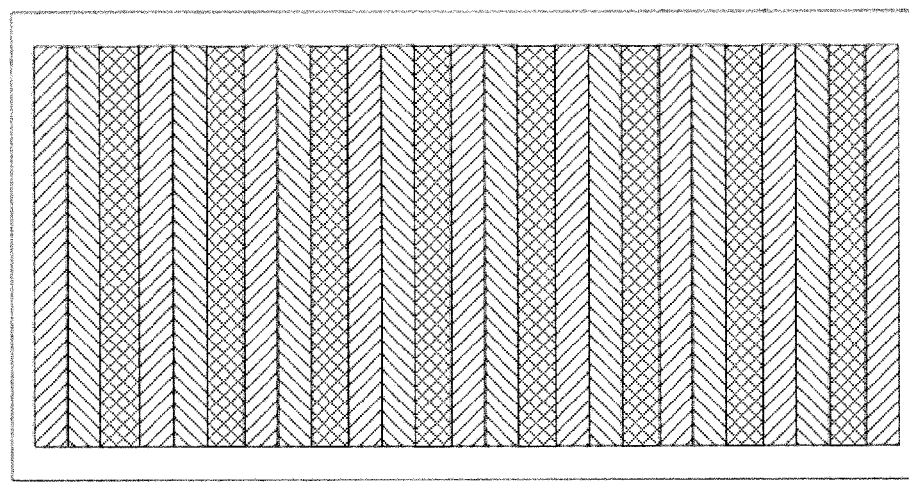
FIG. 8b is an exemplary schematic structural diagram of the substrate, after third-time exposing by utilizing the sixth mask, according to the fourth embodiment of the invention.

Next, with the sixth mask plate 17, the substrate is subjected to third-time exposing, and the structure of the substrate after third-time exposing is as shown in FIG. 8b. Ultimately, through the three times of exposing, the part of the substrate corresponding to the effective viewing area of a liquid crystal panel is completely exposed.

The examples all are based on the RGB three-color mode, in which the number of the color-filter substrates is three. In other cases, the number of the color-filter substrates also may be more than three, for example, in the RGBW, RGBY and CMYK modes. The above-described manufacturing method of a mask plate can also be applied to the cases in which the number of the color-filter substrates is more than three.

In a fifth embodiment of the invention, the step in which a negative photoresist light-shielding material layer is formed on a transparent substrate, may comprise the following: a light-shielding metal layer is formed on a transparent substrate; a negative photoresist material layer is formed on the substrate formed with the light-shielding metal layer.

The negative photoresist light-shielding material layer, which is used in a mask plate for shielding during sealant-curing and is capable of UV-light-shielding, may comprise a light-shielding metal layer. Since the light-shielding metal has no photoresist characteristic, in a patterning process it is required that the light-shielding metal layer is coated thereon with a negative photoresist material layer so as to function as negative photoresist.

According to a sixth embodiment of the invention, if a mask plate for shielding during sealant-curing comprises a light-shielding metal layer and a negative photoresist material layer, then a manufacturing method of the mask plate may comprise the following:

step 201, a light-shielding metal layer is formed on a transparent substrate;

step 202, a negative photoresist material layer is formed on the substrate formed with the light-shielding metal layer;

step 203, with a color-filter mask plate set, the substrate formed with the negative photoresist material layer is subjected to exposing;

step 204, the substrate after exposing is subjected to developing; and step 205, the light-shielding metal layer of the substrate after developing is subjected to etching to form the pattern of the mask plate for shielding during sealant-curing.

The method after step 205 may further comprise the following: the remaining negative photoresist material layer on the mask plate for shielding during sealant-curing is removed.

In this embodiment, the color-filter mask plate set is the mask plate set that is used in exposing a color-filter layer during fabrication of a color-filter substrate.

In the technical solutions of the embodiments of the present invention, a substrate formed with a negative photoresist light-shielding material layer is subjected to exposing, with a color-filter mask plate set that is used in exposing a color-filter layer during fabrication of a color-filter substrate; moreover, the fabrication of the mask plate set can be done in a fabrication plant of a color-filter substrate; therefore, compared with the conventional technology, separate fabrication of a mask plate is not required any more, thereby significantly reducing the manufacturing costs of the mask plate for shielding during sealant-curing.

Apparently, various alterations and modifications can be made by the skilled in the art to the embodiments of the invention, without departing from the spirit and scope of the invention. Therefore, so far as these alterations and modifications of the embodiments of the invention fall in the scope of the claims and their equivalents of the invention, these alterations and modifications are intended to be encompassed by the invention.

The invention claimed is:

1. A manufacturing method of a mask plate for shielding during sealant-curing, comprising:
   forming a negative photoresist light-shielding material layer on a transparent substrate;
   exposing the transparent substrate and the negative photoresist light-shielding material layer which is formed on the transparent substrate with a color-filter mask plate set configured for exposing a color-filter layer during fabrication of a color-filter substrate; and
   developing the transparent substrate and the negative photoresist light-shielding material layer which is formed on the transparent substrate that is exposed to form a pattern of the mask plate;
   wherein the color-filter substrate comp least at least three color-filter layers of different colors, which are all equal in width;
   the color-filter mask plate set comprises one type of color-filter mask plate that corresponds to the at least three color-filter layers of different colors; and
   exposing of the transparent substrate and the negative photoresist light-shielding material layer which is formed on the transparent substrate with a mask olate set comprises:
   with the one type of color-filter mask plate that corresponds to the at least three color-filter layers of different colors, exposing the transparent substrate and the negative photoresist light-shielding material layer which is formed on the transparent substrate at least three times, so that a region on the transparent substrate corresponding to a formed light-shielding pattern is exposed, wherein, for every two continuous times of exposing, a position of the one type of color-filter mask plate is shifted by a predetermined distance,
   wherein, the transparent substrate is transparent to a radiation adopted for the sealant-curing.

2. The manufacturing method of a mask plate according to claim 1, wherein forming of a negative photoresist light-shielding material layer on a transparent substrate comprises:
   forming a light-shielding metal layer on a transparent substrate; and
   forming a negative photoresist material layer on the transparent substrate provided with the light-shielding metal layer.

3. The manufacturing method of a mask plate according to claim 2, wherein developing of the transparent substrate and the negative photoresist light-shielding material layer which is formed on the transparent substrate that is exposed to form the pattern of the mask plate comprises:
   developing the transparent substrate and the negative photoresist light-shielding material layer which is formed on the transparent substrate that is exposed; and
   etching the light-shielding metal layer of the transparent substrate after developing to form the pattern of the mask plate.

4. The manufacturing method of a mask plate according to claim 1, further comprising: remaining negative photoresist material layer on the mask plate for shielding during sealant-curing is removed.

5. A manufacturing method of a mask plate for shielding during sealant-curing comprising:
   forming a negative photoresist light-shielding material layer on a transparent substrate;
   exposing the transparent substrate and the negative photoresist light-shielding material layer which is formed on the transparent substrate with a color-filter mask plate set configured for exposing a color-filter layer during fabrication of a color-filter substrate; and
   developing the transparent substrate and the negative photoresist light-shielding material layer which is formed on the transparent substrate that is exposed to form a pattern of the mask plate; wherein the color-filter substrate comprises at least three color-filter layers of different colors, of which at least two, but not all, are equal in width;
   the color-filter mask plate set comprises a shared mask plate that corresponds to the color-filter layers equal-in-width, and an alone-used mask plate set, of which each mask plate corresponds to each color-filter layer other than the color-filter layers equal-in-width; and
   exposing of the transparent substrate and the negative photoresist light-shielding material layer which is formed on the transparent substrate with a mask plate set comprises:
   with the shared mask plate, exposing the transparent substrate and the negative photoresist light-shielding material layer which is formed on the transparent substrate at least two times, and with each alone-used mask plate that corresponds to each color-filter layer other than the color-filter layers equal-in-width, exposing the transparent substrate and the negative photoresist light-shielding material layer which is formed on the transparent substrate respectively, so that a region on the transparent substrate corresponding to a formed light-shielding pattern is exposed; wherein, in exposing of the transparent substrate with the shared mask plate, for every two continuous times of exposing, a position of the shared mask plate is shifted by a predetermined distance,
   wherein, the transparent substrate is transparent to a radiation adopted for the sealant-curing.

6. The manufacturing method of a mask plate according to claim 5, further comprising: remaining negative photoresist material layer on the mask plate for shielding during sealant-curing is removed.

7. The manufacturing method of a mask plate according to claim 5, wherein forming of a negative photoresist light-shielding material layer on a transparent substrate comprises:
   forming a light-shielding metal layer on a transparent substrate; and
   forming a negative photoresist material layer on the transparent substrate provided with the light-shielding metal layer.

8. The manufacturing method of a mask plate according to claim 7, wherein developing of the transparent substrate and the negative photoresist light-shielding material layer which is formed on the transparent substrate that is exposed to form the pattern of the mask plate comprises:
 developing the transparent substrate and the negative photoresist light-shielding material layer which is formed on the transparent substrate that is exposed; and
 etching the light-shielding metal layer of the transparent substrate after developing to form the pattern of the mask plate.

* * * * *